US010971618B2

(12) United States Patent
Davidescu et al.

(10) Patent No.: US 10,971,618 B2
(45) Date of Patent: Apr. 6, 2021

(54) GENERATING MILLED STRUCTURAL ELEMENTS WITH A FLAT UPPER SURFACE

(71) Applicant: Applied Materials Israel Ltd., Rehovot (IL)

(72) Inventors: Ron Davidescu, Rehovot (IL); Yehuda Zur, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 96 days.

(21) Appl. No.: 16/530,331

(22) Filed: Aug. 2, 2019

(65) Prior Publication Data

US 2021/0036142 A1 Feb. 4, 2021

(51) Int. Cl.

| | |
|---|---|
| ***H01L 21/302*** | (2006.01) |
| ***H01L 29/78*** | (2006.01) |
| ***H01L 21/30*** | (2006.01) |
| ***H01L 21/306*** | (2006.01) |

(52) U.S. Cl.

CPC .......... *H01L 29/7801* (2013.01); *H01L 21/30* (2013.01); *H01L 21/302* (2013.01); *H01L 21/306* (2013.01); *H01L 29/7835* (2013.01)

(58) Field of Classification Search

CPC ... H01L 29/7801; H01L 29/78; H01L 29/786; H01L 21/302; H01L 21/306; H01L 21/30

See application file for complete search history.

(56) References Cited

U.S. PATENT DOCUMENTS

| | | |
|---|---|---|
| 4,540,952 A | 9/1985 | Williams |
| 5,035,770 A | 7/1991 | Braun |
| 5,541,411 A | 7/1996 | Lindquist et al. |
| 5,616,921 A | 4/1997 | Talbot et al. |
| 5,752,309 A | 5/1998 | Partee et al. |
| 5,952,658 A | 9/1999 | Shimase et al. |
| 6,359,254 B1 | 3/2002 | Brown |

(Continued)

FOREIGN PATENT DOCUMENTS

| | | |
|---|---|---|
| KR | 10-1999-0036438 A | 5/1999 |
| KR | 10-2012-0109641 A | 10/2012 |
| WO | 2018/052424 A1 | 3/2018 |

OTHER PUBLICATIONS

International Search Report and Written Opinion of the International Searching Authority for Application No. PCT/US2020/032880, dated Sep. 7, 2020, 9 pages.

(Continued)

*Primary Examiner* — Douglas M Menz

(74) *Attorney, Agent, or Firm* — Kilpatrick Townsend & Stockton LLP

(57) ABSTRACT

A miller, a non-transitory computer-readable medium, and a method for milling a multi-layered object. The method may include milling each structural element of an array of structural elements that are spaced apart from each other by gaps to provide the milled structural elements, wherein each milled structural element has a flat upper surface, wherein prior the milling each one of the structural elements of the array has a flat upper surface of a certain width, wherein the certain width is of a nanometric scale. The milling of each structural element of the array may include scanning a defocused ion beam of the certain width along a longitudinal axis of the structural element. A current intensity of the defocused ion beam decreases with a distance from a middle of the defocused ion beam.

18 Claims, 6 Drawing Sheets

(56) References Cited

U.S. PATENT DOCUMENTS

| | | | |
|---|---|---|---|
| 6,392,219 | B1 | 5/2002 | McCormick et al. |
| 6,414,307 | B1 | 7/2002 | Gerlach et al. |
| 6,497,194 | B1 | 12/2002 | Libby et al. |
| 6,670,610 | B2 | 12/2003 | Shemesh et al. |
| 7,825,735 | B1 | 11/2010 | Wessendorf |
| 2002/0003649 | A1 | 1/2002 | Feng |
| 2002/0074494 | A1 | 6/2002 | Lundquist et al. |
| 2003/0098416 | A1 | 5/2003 | Shemesh et al. |
| 2004/0140438 | A1 | 7/2004 | Gerlach et al. |
| 2005/0073775 | A1 | 4/2005 | Chang et al. |
| 2005/0218994 | A1 | 10/2005 | Guckenberger et al. |
| 2009/0079958 | A1 | 3/2009 | Gunther et al. |
| 2015/0255248 | A1 | 9/2015 | Boguslavsky et al. |
| 2018/0166304 | A1 | 6/2018 | Berry, III et al. |

OTHER PUBLICATIONS

International Search Report and Written Opinion of the International Searching Authority for Application No. PCT/US2020/041439, dated Oct. 23, 2020, 8 pages.

U.S. Appl. No. 16/526,989 Non-Final Office Action dated Jan. 6, 2021, 10 pages.

PRIOR ART

GENERATING MILLED STRUCTURAL ELEMENTS WITH A FLAT UPPER SURFACE

BACKGROUND

Objects such as various semiconductor objects (e.g. semiconductor wafers, display panels, solar wafers) may include arrays of structural elements that have a substantial rectangular cross section and are separated from each other by empty gaps. Non-limiting example of such structural elements may include memory cells, memory arrays, and the like.

An even milling of these structural elements will result in milled structural elements that have a sloped cross section such as a triangular cross section. An even milling is obtained when substantially each point receive substantially the same amount of radiation during the milling process.

The triangular cross section is obtained because the number of emitted material atoms increases near the edges of the structural elements. The chances of an irradiated material atom to escape from a structural element increases as the irradiated material atom is closer to any external surface of the structural element. Accordingly—irradiated material atoms that are closer to the sidewalls of the structural element may escape through the sidewalls of the structural elements—and not only through the top surface of the structural element. Accordingly, the actual milling yield increases as a function of distance from the center of the structural element.

FIG. 1 illustrates, from top to bottom:

a. An array of structural elements 111 before the milling. The structural elements 111 are spaced apart from each other by gaps 115. Each structural element has a flat top surface 112, and vertical sidewalls 113 and 114. It is assumed that the different structural elements of the array are ideally identical.
b. An array of partially milled structural elements 121. The partially milled structural elements 121 are the outcome of a first milling iteration. The top part of each one of the partially milled structural elements has a triangular cross section. The lower part of each one of the partially milled structural elements has sidewalls. The partially milled structural elements 121 are spaced apart by gaps 125.
c. An array of milled structural elements 131. The milled structural elements are the outcome of a second milling iteration. Each one of the milled structural elements 131 has a triangular shaped cross section. The milled structural elements 131 are spaced apart by gaps 135.

There is a growing need to generate milled structural elements having flat top surfaces.

SUMMARY

There may be provided a method for generating milled structural elements, the method includes: milling each structural element of an array of structural elements that are spaced apart from each other by gaps to provide the milled structural elements, where each milled structural element of the array has a flat upper surface; where prior to the milling, the each structural element has a flat upper surface of a certain width, where the certain width is of a nanometric scale. The method also includes where the milling includes scanning a defocused ion beam of the certain width along a longitudinal axis of the each structural element. The method also includes where a current intensity of the defocused ion beam decreases with a distance from a middle of the defocused ion beam.

There may be provided a miller that includes: a controller. The miller also includes a focused ion beam module. The miller also includes where the focused ion beam module is configured to mill, under a control of the controller, each structural element of an array of structural elements that are spaced apart from each other by gaps to provide milled structural elements, where each milled structural element has a flat upper surface; where prior to milling, the each structural element has a flat upper surface of a certain width, where the certain width is of a nanometric scale. The miller also includes where a milling, by the focused ion beam module, of the each structural element includes scanning a defocused ion beam of the certain width along a longitudinal axis of the each structural element. The miller also includes where a current intensity of the defocused ion beam decreases with a distance from a middle of the defocused ion beam.

There may be provided a non-transitory computer-readable medium that stores instructions for generating milled structural elements, the instructions causing a miller to perform a method including: milling each structural element of an array of structural elements that are spaced apart from each other by gaps to provide the milled structural elements, each milled structural element has a flat upper surface; where prior the milling the each structural element has a flat upper surface of a certain width, where the certain width is of a nanometric scale. The non-transitory computer-readable medium also includes where the milling includes scanning a defocused ion beam of the certain width along a longitudinal axis of the each structural element. The non-transitory computer-readable medium also includes where a current intensity of the defocused ion beam decreases with a distance from a middle of the defocused ion beam.

BRIEF DESCRIPTION OF THE DRAWINGS

Examples of claimed subject matter may be particularly pointed out and distinctly claimed in the concluding portion of the specification. Embodiments of the present disclosure, however, both as to organization and method of operation, together with objects, features, and advantages thereof, may best be understood by reference to the following detailed description when read with the accompanying drawings in which:

Figure 1:
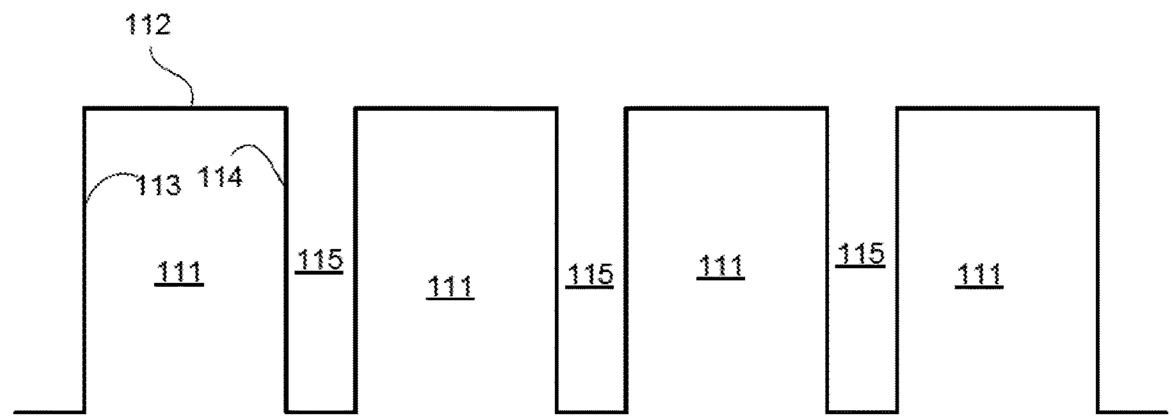
FIG. 1 is an example of prior art structural elements, prior art partially milled structural elements, and prior art milled structural elements.
Figure 1:
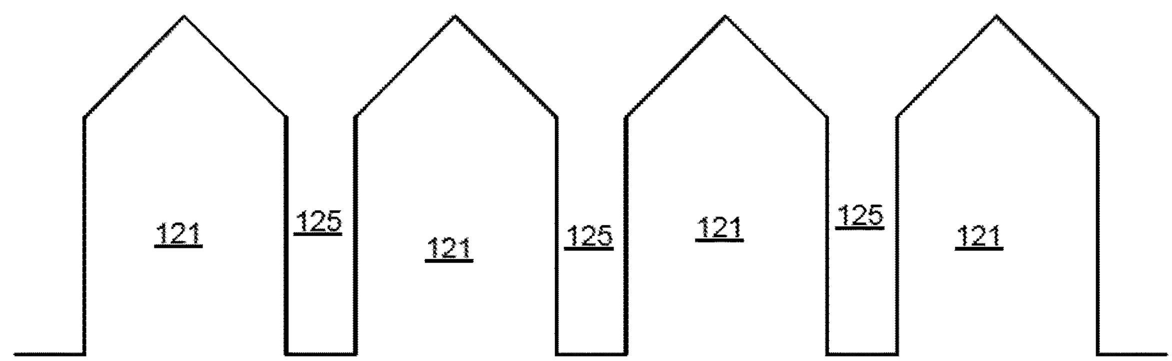
Figure 1:
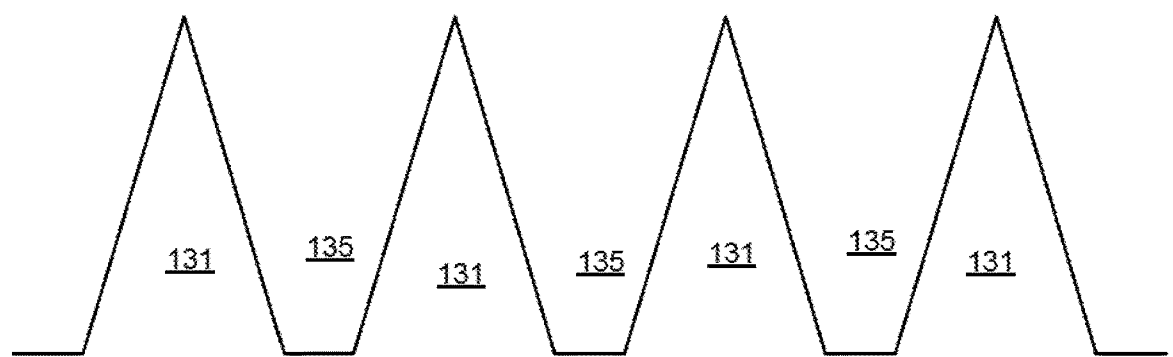

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the embodiments of the present disclosure . However, it will be understood by those skilled in the art that the present embodiments of the present disclosure may be practiced without these specific details. In other instances, well-known methods, procedures, and components have not been described in detail so as not to obscure the present embodiments of the present disclosure .

The subject matter regarded as the embodiments of the present disclosure is particularly pointed out and distinctly claimed in the concluding portion of the specification. The embodiments of the present disclosure , however, both as to organization and method of operation, together with objects, features, and advantages thereof, may best be understood by reference to the following detailed description when read with the accompanying drawings.

Because the illustrated embodiments of the present embodiments of the present disclosure may for the most part, be implemented using electronic components and circuits known to those skilled in the art, details will not be explained in any greater extent than that considered necessary as illustrated above, for the understanding and appreciation of the underlying concepts of the present embodiments of the present disclosure and in order not to obfuscate or distract from the teachings of the present embodiments of the present disclosure.

Any reference in the specification to a method should be applied mutatis mutandis to a miller capable of executing the method and should be applied mutatis mutandis to a non-transitory computer-readable medium that stores instructions that once executed by a computer result in the execution of the method.

Any reference in the specification to a system should be applied mutatis mutandis to a method that may be executed by the system and should be applied mutatis mutandis to a non-transitory computer-readable medium that stores instructions that may be executed by the miller.

Any reference in the specification to a non-transitory computer-readable medium should be applied mutatis mutandis to a miller capable of executing the instructions stored in the non-transitory computer-readable medium and should be applied mutatis mutandis to method that may be executed by a computer that reads the instructions stored in the non-transitory computer-readable medium.

There may be provided a miller, a method, and a non-transitory computer-readable medium for milling structural elements that are spaced apart from each other by gaps, to provide milled structural elements that have a flat top surface.

There is a need to compensate for the difference in the actual milling yield across the structural element and to provide irradiated atom materials substantially the same chances of exiting the structural element, regardless of the distance between the irradiated material atom and the sidewalls of the structural element.

The term substantial may refer to a limited amount of deviation. For example—up to 5%, 10%, 15% and the like.

Figure 2:
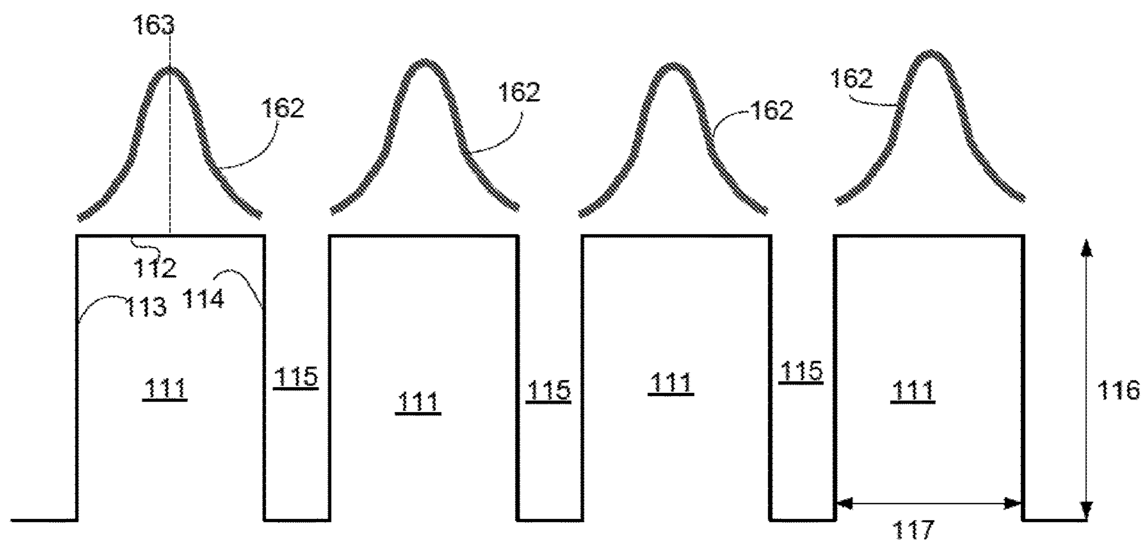
FIG. 2 is an example of structural elements, milled structural elements and a defocused ion beam current intensity distribution, according to one or more embodiments of the disclosure.
Figure 2:
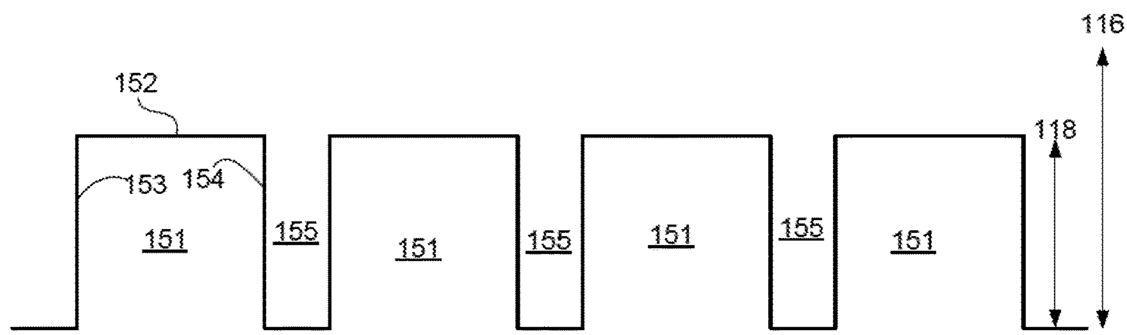

FIG. 2 is an example of structural elements 111, milled structural elements 151 and a defocused ion beam current intensity distribution 162 according to one or more embodiments of the disclosure.

FIG. 2 illustrates, from top to bottom:

a. An example of a defocused ion beam current intensity distribution 162. The current intensity of the defocused ion beam decreases with a distance from a middle 163 of the defocused ion beam. The current intensity is higher at the middle 163 of the defocused ion beam and is lower near the edge of the defocused ion beam. This provides to irradiated atom materials substantially the same chances of exiting the structural element regardless of the distance between the irradiated material atom and the sidewalls of the structural element.
b. An array of structural elements 111 before the milling. The structural elements 111 are spaced apart from each other by gaps 115, have a flat top surface 112 and vertical sidewalls 113 and 114. The gap 115 can be a space between the vertical sidewalls of structural elements 111. The gap can be an air gap that is created during the semiconductor manufacturing process, and is to be filled with material in a later step of the semiconductor manufacturing process. The height of each structural element is denoted 116. The width of each structural element is denoted 117.
c. An array of milled structural elements 151 that have a rectangular cross section. Each milled structural element 151 has a flat top surface 152 and vertical sidewalls 153 and 154. The milled structural elements 151 are spaced apart by gaps 155. The height of each milled structural element is denoted 118.

Figure 3:
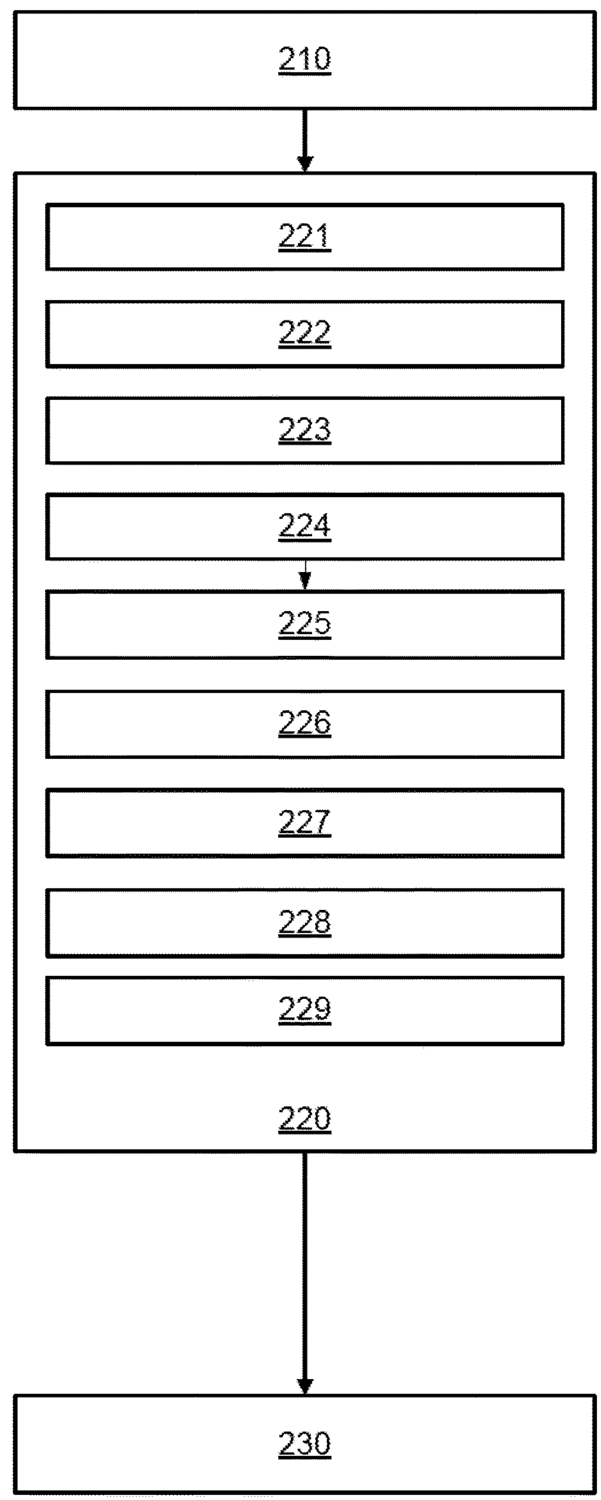
FIG. 3 illustrates an example of a method.

FIG. 3 illustrates an example of a method 200 for generating milled structural elements.

Method 200 may start by step 210 of receiving structural element information related to an array of structural elements. The array includes structural elements that are spaced apart from each other by gaps. Each structural element may have a flat upper surface of a certain width. The certain width is of a nanometric scale (for example between 100 nanometer to 1000 nanometer). Each structural element may have vertical sidewalls.

The structural element information may define the certain width (of each structural element).

Step 210 may be followed by step 220 of determining, based at least in part on the structural element information, a milling scheme.

Step 220 may include at least one of the following:

a. Step 221 of determining at least one milling parameter to provide the defocused ion beam of the certain width. The defocused ion beam has the certain width at the location where the defocused ion beam meets the flat upper surface of the structural element.
b. Step 222 of determining a desired current intensity distribution of the defocused ion beam.
c. Step 223 of determining a milling scan pattern and one or more additional milling parameters. The one or more additional milling parameters may include a defocus strength of the defocused ion beam, and a defocused ion beam current distribution.
d. Step 224 of receiving or determining a shape of an upper part of evenly milled structural elements of the array.
e. Step 225 of determining the milling scheme to compensate for deviations (from a flat top surface) of the shape of the upper part of an evenly milled structural element. Step 225 may be preceded by step 224. For example—assuming that a first function describes the cross section of the top of the evenly milled structural element then the milling scheme should irradiate the structural element with radiation that follows a second function, the second function is substantially equal to the first function.

f. Step 226 of determining the milling scheme based on, at least, one of more materials (of the structural elements) to be milled during the milling process.

g. Step 227 of determining the milling scheme based on, at least dimensions of the milled structural elements.

h. Step 228 of determining the milling scheme based on, at least, a smoothness of the top surfaces of the milled structural elements.

i. Step 229 of determining the milling rate.

Milling parameters determined during step 220 may include at least one out of the defocus strength, the duration of the milling, the bias voltage supplied to an objective lens, the overall ion beam energy, the overall current of the ion beam.

The defocus strength may affect the current distribution of the defocused ion beam.

The duration of milling may determine the height reduction the structural elements by the milling.

The objective lens bias voltage controls the defocus strength.

The overall defocused ion beam energy does not affect the defocusing but stronger defocused ion beam energy allows the defocused ion beam to increase the height decrement of the structural elements and may reduce top surface deformation.

The overall ion beam current does not determine the defocusing but determines the milling rate. For example, higher ion beam current results in faster milling.

Step 220 may include using a mapping between the milling scheme and one or more parameters of the milled and/or non-milled structural elements. The mapping can be learnt in one or more manners. For example—the mapping may be based on actual milling operations that are executed while applying different milling parameters. Only a part of all possible combinations of milling parameters values may be tested. Yet for another example, the milling operations may be based on simulations or other estimates of the milling, even without performing any milling.

Step 220 may be followed by step 230 of milling each structural element of the array to provide the milled structural elements. Each milled structural element has a flat upper surface of the certain width.

Step 230 may include milling each structural element of the array by scanning the defocused ion beam of the certain width along a longitudinal axis of the structural element. A current intensity of the defocused ion beam decreases with a distance from a middle of the defocused ion beam.

Figure 4:
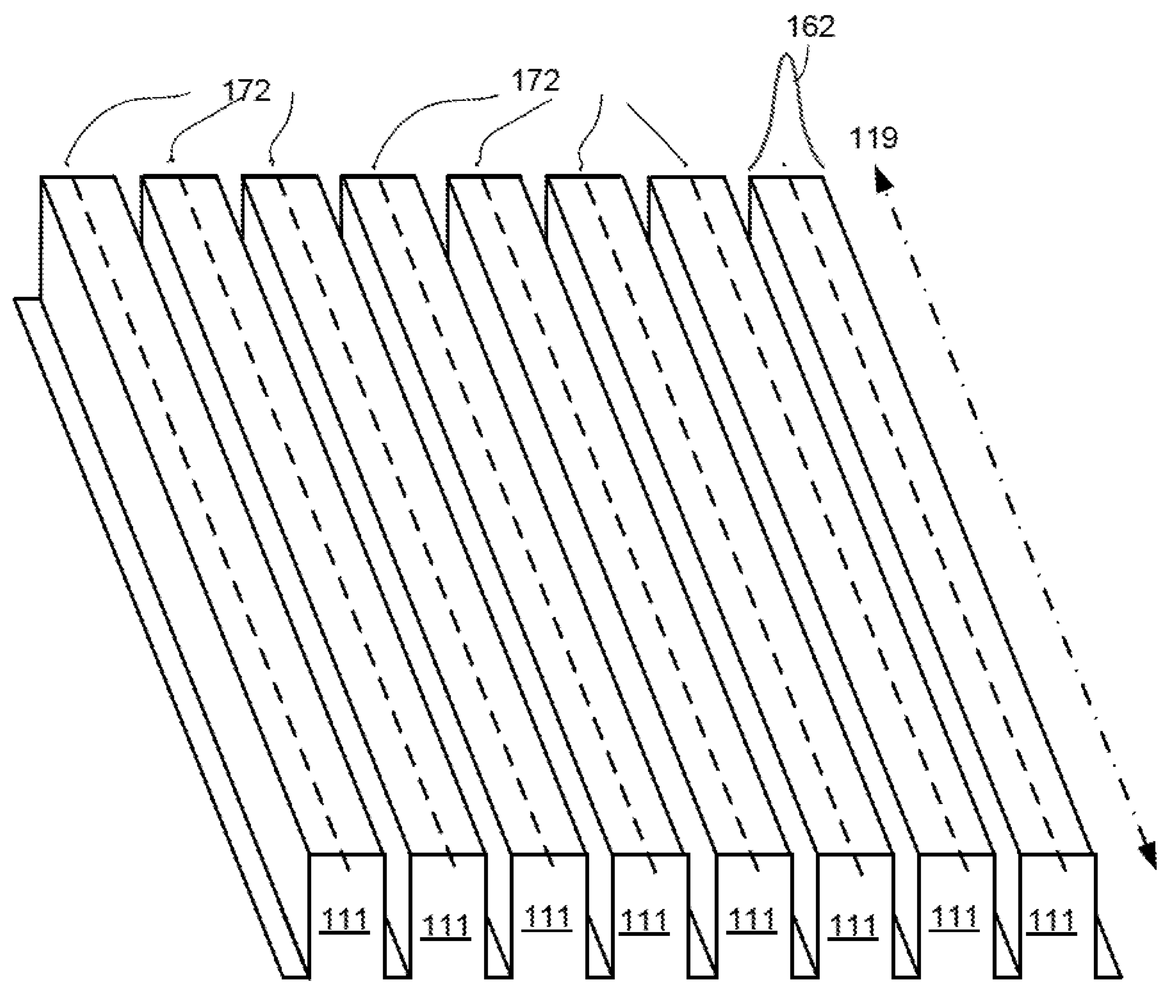
FIG. 4 is an example of structural elements, scan lines of a scan pattern, and a defocused ion beam current intensity distribution according to one or more embodiments of the disclosure.

FIG. 4 is an example of structural elements 111, scan lines 172 of a scan pattern, and a defocused ion beam current intensity distribution 162 according to one or more embodiments of the disclosure.

The scan lines 172 are parallel to the longitudinal axis (for example, longitudinal axis 119) of the structural elements 111 and are positioned at the center of the structural elements.

When following these scan lines, the defocused ion beam (having a defocused ion beam current intensity distribution 162) “covers” the structural elements 111.

For each structural element, the overall current of the defocused ion beam increases with a distance from the vertical sidewalls of the structural element—thereby compensating for the increment of extraction of material with a reduction in distance from the sidewalls of the structural elements.

Figure 5:
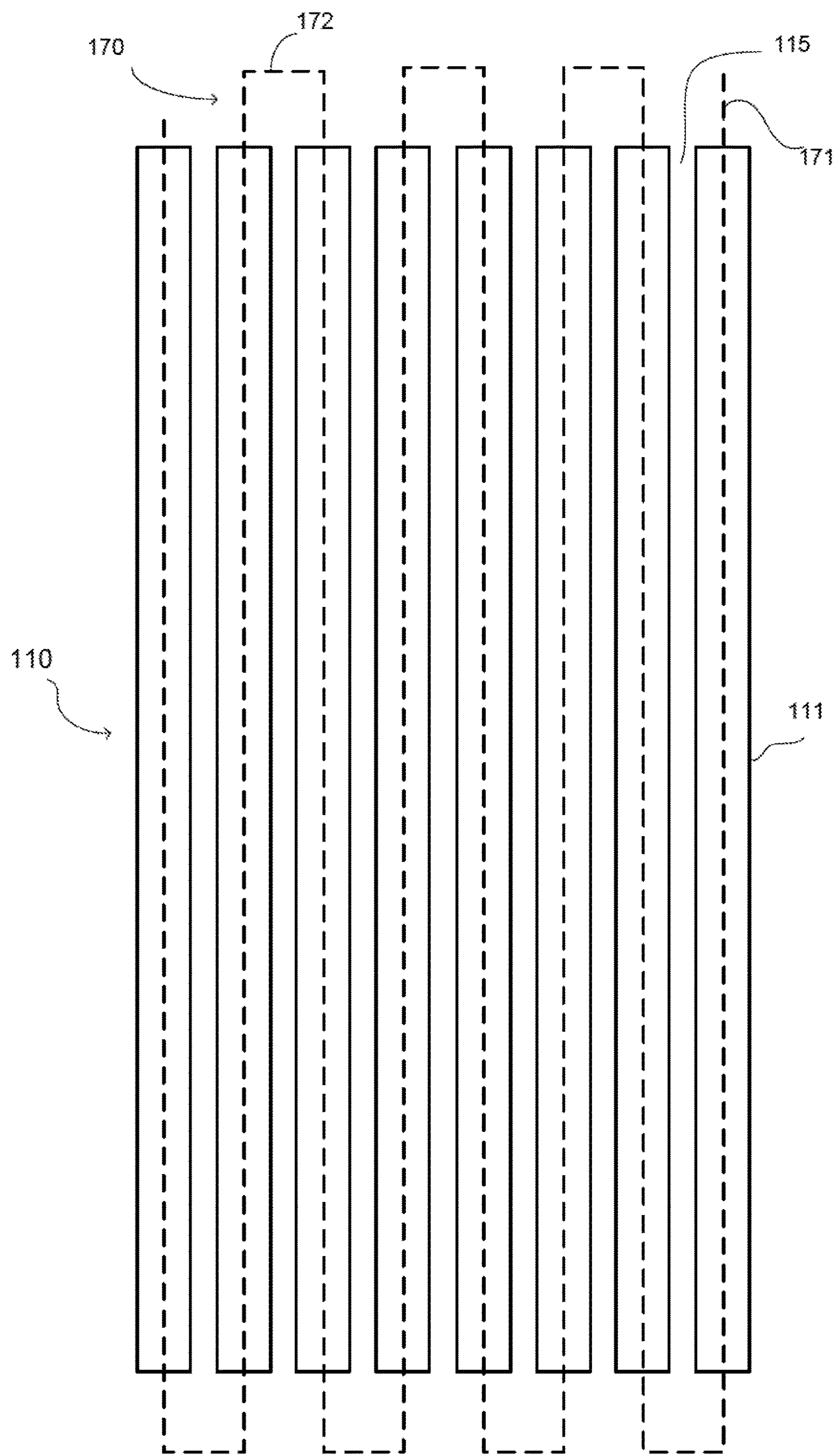
FIG. 5 is an example of structural elements and a part of a scan pattern according to one or more embodiments of the disclosure.

FIG. 5 is an example of an array 110 of structural elements 111, gaps 115 formed between the structural elements, and a part of a scan pattern 170 that includes scan lines 172 and counter scan lines 171. The scan lines 172 are parallel to the longitudinal axis of the structural elements 111 and are positioned at the center of the structural elements 111.

The counter scan lines 171 are located outside the array 110 and are used to “move” the defocused ion beam between one scan line to another.

Figure 6:
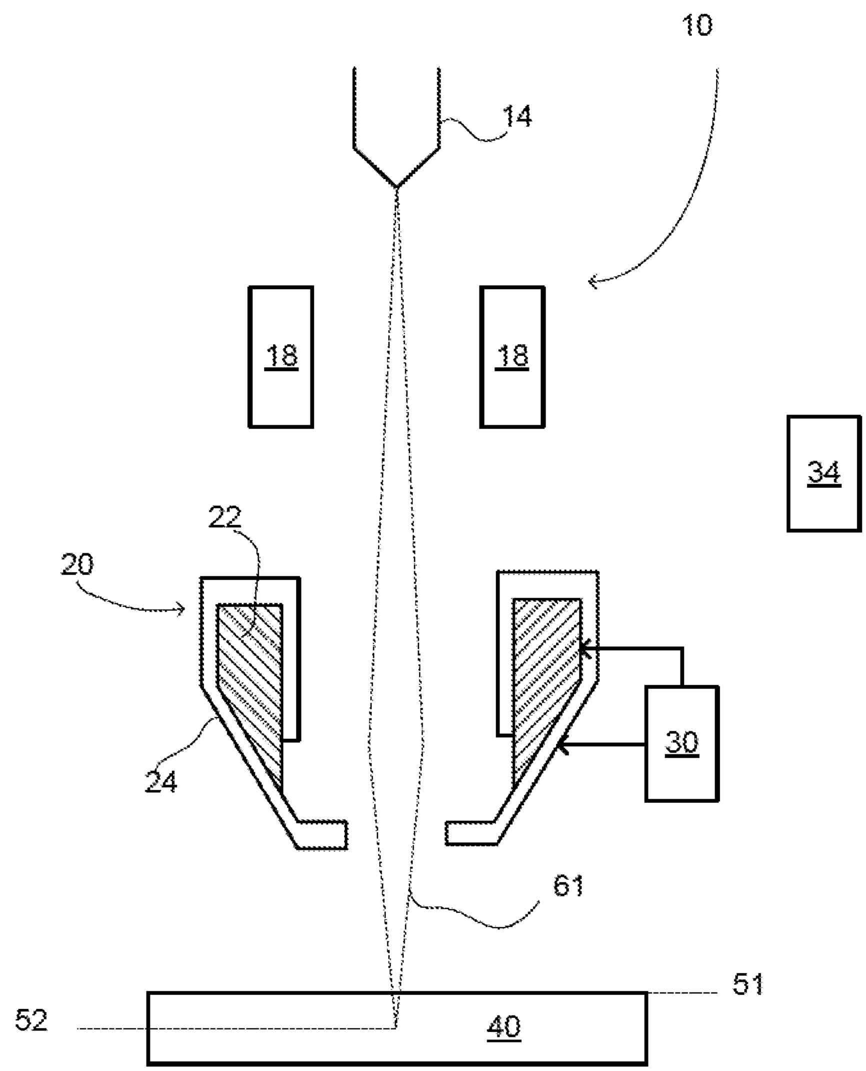
FIG. 6 is an example of a focused ion beam module and a controller.

FIG. 6 illustrates an example of an object 40, such as a semiconductor wafer, that includes array 110 of structural elements 111 and a focused ion beam module 10 of a miller.

The focused ion beam module 10 includes a beam source 14, first lens 18, objective lens 20, and power supply unit 30. The focused ion beam module 10 is controlled by controller 34.

The first lens 18 may be a condenser and/or a scanning lens.

Objective lens 20 may include a magnetic lens 22 and an electrostatic lens 24. The bias voltage may be applied to the electrostatic lens 24.

The focused ion beam module 10 may include additional optical elements, other optical elements, and the like.

The focused ion beam module 10 may generate a defocused ion beam 62.

The defocused ion beam 62 may be deflected once or multiple times.

FIG. 6 illustrates ion beam 62 that is focused by the objective lens 20 and reaches the upper surface (located in first plane 51) of the object 40. The focus plane 52 is below the upper surface of the object 40. The upper surface of the object 40 may be located at a plane of the top surfaces of the structural elements. It should be noted that the focus plane of the defocused ion beam may be above the upper surface.

The defocus strength, as well as other milling parameters may be controlled by controller 34.

The embodiments of the present disclosure may also be implemented in a computer program for running on a computer system, at least including code portions for performing steps of a method according to the embodiments of the present disclosure when run on a programmable apparatus, such as a computer system or enabling a programmable apparatus to perform functions of a device or system according to the embodiments of the present disclosure . The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer-readable medium. All or some of the computer program may be provided on computer-readable media permanently, removable or remotely coupled to an information processing system. The computer-readable media may include, for example and without limitation, any number of the following: magnetic storage media including disk and tape storage media; optical storage media such as compact disk media and digital video disk storage media; nonvolatile memory storage media including semiconductor-based memory units such as flash memory, erasable memory units, or ferromagnetic digital memories; memristors, volatile storage media including registers, buffers or caches, main memory, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the embodiments of the present disclosure has been described with reference to specific examples of embodiments of the present disclosure . It will, however, be evident that various modifications and changes may be made therein without departing from the broader spirit and scope of the embodiments of the present disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the present disclosure described herein are, for example, capable of operation in other orientations than those illustrated or otherwise described herein.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the embodiments of the present disclosure is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the present disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the present disclosure.

We claim:

1. A method for generating milled structural elements, the method comprises:

milling each structural element of an array of structural elements that are spaced apart from each other by gaps to provide the milled structural elements, wherein each milled structural element of the array has a flat upper surface; wherein prior to the milling, the each structural element has a flat upper surface of a certain width, wherein the certain width is of a nanometric scale;

wherein the milling comprises scanning a defocused ion beam of the certain width along a longitudinal axis of the each structural element; and wherein a current intensity of the defocused ion beam decreases with a distance from a middle of the defocused ion beam.

2. The method according to claim 1 comprising receiving structural element information regarding the certain width and determining at least one milling parameter to provide the defocused ion beam of the certain width.

3. The method according to claim 1 comprising:

receiving or determining a shape of an upper part of evenly milled structural elements of the array;

determining a milling scheme that compensates for deviations of the shape of the upper part of the evenly milled structural elements from having a flat top surface; and applying the milling scheme during the milling of the each structural element.

4. The method according to claim 3 wherein the determining of the milling scheme comprises determining a milling scan pattern and one or more additional milling parameters.

5. The method according to claim 4 wherein the one or more additional milling parameters comprise a defocus strength of the defocused ion beam, and a defocused ion beam current distribution.

6. The method according to claim 1, wherein the defocused ion beam has a focus plane above or below the flat upper surface of the structural elements of the array.

7. A miller that comprises:

a controller; and a focused ion beam module;

wherein the focused ion beam module is configured to mill, under a control of the controller, each structural element of an array of structural elements that are spaced apart from each other by gaps to provide milled structural elements, wherein each milled structural element has a flat upper surface; wherein prior to milling, the each structural element has a flat upper surface of a certain width, wherein the certain width is of a nanometric scale;

wherein a milling, by the focused ion beam module, of the each structural element comprises scanning a defocused ion beam of the certain width along a longitudinal axis of the each structural element; and wherein a current intensity of the defocused ion beam decreases with a distance from a middle of the defocused ion beam.

8. The miller according to claim 7 wherein the controller is configured to receive structural element information regarding the certain width and determine at least one milling parameter to provide the defocused ion beam of the certain width.

9. The miller according to claim 7 wherein the controller is configured to:

receive or determine a shape of an upper part of evenly milled structural elements of the array;

determine a milling scheme that compensates for deviations of the shape of the upper part of the evenly milled structural elements from having a flat top surface; and wherein the focused ion beam module is configured to apply the milling scheme during the milling of the each structural element.

10. The miller according to claim 9 wherein the controller is configured to determine the milling scheme by determining a milling scan pattern and one or more additional milling parameters.

11. The miller according to claim 10 wherein the one or more additional milling parameters comprise a defocus strength of the defocused ion beam, and a defocused ion beam current distribution.

12. The miller according to claim 7, wherein the defocused ion beam has a focus plane below the flat upper surface of the structural elements of the array.

13. A non-transitory computer-readable medium that stores instructions for generating milled structural elements, the instructions causing a miller to perform a method comprising:

milling each structural element of an array of structural elements that are spaced apart from each other by gaps to provide the milled structural elements, each milled structural element has a flat upper surface; wherein prior the milling the each structural element has a flat upper surface of a certain width, wherein the certain width is of a nanometric scale;

wherein the milling comprises scanning a defocused ion beam of the certain width along a longitudinal axis of the each structural element; and wherein a current intensity of the defocused ion beam decreases with a distance from a middle of the defocused ion beam.

14. The non-transitory computer-readable medium according to claim 13, the method further comprising receiving structural element information regarding the certain width and determining at least one milling parameter to provide the defocused ion beam of the certain width.

15. The non-transitory computer-readable medium according to claim 13, the method further comprising:

receiving or determining a shape of an upper part of evenly milled structural elements of the array;

determining a milling scheme that compensates for deviations of the shape of the upper part of the evenly milled structural elements from having a flat top surface; and applying the milling scheme during the milling of the each structural element.

16. The non-transitory computer-readable medium according to claim 15 wherein the determining of the milling scheme comprises determining a milling scan pattern and one or more additional milling parameters.

17. The non-transitory computer-readable medium according to claim 16 wherein the one or more additional milling parameters comprise a defocus strength of the defocused ion beam and a defocused ion beam current distribution.

18. The non-transitory computer-readable medium according to claim 13, wherein the defocused ion beam has a focus plane below the flat upper surface of the structural elements of the array.

* * * * *

UNITED STATES PATENT AND TRADEMARK OFFICE

CERTIFICATE OF CORRECTION

PATENT NO. : 10,971,618 B2
APPLICATION NO. : 16/530331
DATED : April 6, 2021
INVENTOR(S) : Ron Davidescu and Yehuda Zur It is certified that error appears in the above-identified patent and that said Letters Patent is hereby corrected as shown below:

In the Specification

Column 1, Line 4, please add the following new heading and paragraph before the heading BACKGROUND:
--STATEMENT AS TO RIGHTS TO INVENTIONS MADE UNDER FEDERALLY SPONSORED RESEARCH AND DEVELOPMENT
The project leading to this application has received funding from the ECSEL Joint Undertaking (JU) under grant agreement No. 783158 (REACTION). The JU receives support from the European Union's Horizon 2020 research and innovation programme and Italy, Germany, Belgium, Sweden, Austria, Romania, Slovakia, France, Poland, Spain, Ireland, Switzerland, Israel.--

Signed and Sealed this
Fifth Day of December, 2023

Katherine Kelly Vidal

Katherine Kelly Vidal
*Director of the United States Patent and Trademark Office*